(12) United States Patent
Kwon et al.

(10) Patent No.: US 11,508,940 B2
(45) Date of Patent: Nov. 22, 2022

(54) DISPLAY DEVICE WITH OPTICAL PATTERN LAYER

(71) Applicant: Samsung Display Co., LTD., Yongin-si (KR)

(72) Inventors: Ohjeong Kwon, Hwaseong-si (KR); Hongyeon Lee, Suwon-si (KR); Seungyeon Jeong, Hwaseong-si (KR); Minju Han, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 209 days.

(21) Appl. No.: 16/894,184

(22) Filed: Jun. 5, 2020

(65) Prior Publication Data

US 2021/0066665 A1    Mar. 4, 2021

(30) Foreign Application Priority Data

Aug. 27, 2019    (KR) .................. 10-2019-0105113

(51) Int. Cl.
*H01L 51/52* (2006.01)
*H01L 27/32* (2006.01)

(52) U.S. Cl.
CPC ........ *H01L 51/5268* (2013.01); *H01L 27/322* (2013.01); *H01L 27/3244* (2013.01); *H01L 51/5253* (2013.01); *H01L 51/5281* (2013.01); *H01L 51/5284* (2013.01); *H01L 2251/5315* (2013.01)

(58) Field of Classification Search
CPC combination set(s) only.
See application file for complete search history.

(56) References Cited

U.S. PATENT DOCUMENTS

| | | | |
|---|---|---|---|
| 9,678,379 B2 | 6/2017 | Hong et al. | |
| 10,935,832 B2* | 3/2021 | Tien | G02B 5/0278 |
| 2012/0286258 A1* | 11/2012 | Naraoka | C09K 11/06 257/40 |
| 2012/0307191 A1 | 12/2012 | Park et al. | |
| 2014/0001448 A1* | 1/2014 | Naraoka | H01L 51/5271 257/40 |
| 2014/0361264 A1* | 12/2014 | Choi | H01L 51/5284 257/40 |
| 2015/0041779 A1* | 2/2015 | Park | H01L 51/5253 362/326 |
| 2015/0228929 A1* | 8/2015 | Lamansky | H01L 27/3244 257/40 |
| 2020/0058904 A1* | 2/2020 | Kim | H01L 51/5206 |
| 2020/0075682 A1 | 3/2020 | Jeong et al. | |

FOREIGN PATENT DOCUMENTS

| | | |
|---|---|---|
| JP | 2015-191787 | 11/2015 |
| KR | 10-2013-0008096 | 1/2013 |
| KR | 10-1421025 | 7/2014 |
| KR | 10-1678649 | 11/2016 |

* cited by examiner

*Primary Examiner* — Nduka E Ojeh
(74) *Attorney, Agent, or Firm* — Kile Park Reed & Houtteman PLLC

(57) ABSTRACT

A display device includes a light emitting element layer, and an optical pattern layer disposed on the light emitting element layer. The optical pattern layer includes a first pattern layer having a base part and protruding parts, and a second pattern layer having a refractive index less than a refractive index of the first pattern layer to scatter light incident to the optical pattern layer and minimize reduction in front efficiency, thereby providing an improved display quality of a side viewing angle.

17 Claims, 12 Drawing Sheets

DISPLAY DEVICE WITH OPTICAL PATTERN LAYER

CROSS-REFERENCE TO RELATED APPLICATION(S)

This application claims priority to and benefits of Korean Patent Application No. 10-2019-0105113 under 35 U.S.C. § 119, filed on Aug. 27, 2019 in the Korean Intellectual Property Office, the entire contents of which are incorporated herein by reference.

BACKGROUND

The disclosure relates to a display device, and more particularly, to a display device including an optical pattern layer disposed on a light emitting element layer.

Various display devices used for multimedia devices such as televisions, mobile phones, tablet computers, navigation units, and game consoles have been developed. When the above-described display devices are used, a color difference phenomenon according to a viewing angle occurs to degrade a display quality of the display device.

Thus, various methods have been introduced in order to improve the color difference phenomenon according to a viewing angle.

SUMMARY

The disclosure provides a display device including an optical pattern layer for improving a display quality difference according to a side viewing angle.

The disclosure also provides a display device having an improved display quality at a side viewing angle by minimizing reduction in front efficiency and optimizing a shape of a pattern layer.

In an embodiment, a display device may include a light emitting element layer; and an optical pattern layer disposed on the light emitting element layer. The optical pattern layer may include a first pattern layer having a first refractive index and including a base part and protruding parts spaced apart from each other on the base part; and a second pattern layer disposed on the first pattern layer and having a second refractive index less than the first refractive index.

In an embodiment, the light emitting element layer may include a first electrode; a second electrode facing the first electrode; a light emitting layer disposed between the first electrode and the second electrode and including an organic electroluminescent material or a quantum dot; and an encapsulation layer disposed on the second electrode. The first electrode may be a reflective electrode, and the second electrode may be a transmissive electrode or a transflective electrode.

In an embodiment, the display device may further include an optical member disposed on the light emitting element layer, and the optical member may include at least one of a polarizing layer or a color filter layer.

In an embodiment, the optical member may be disposed between the light emitting element layer and the optical pattern layer or disposed on the optical pattern layer.

In an embodiment, each of the protruding parts may have a cylindrical or prismatic shape protruding from the base part.

In an embodiment, each of the protruding parts may include a bottom surface adjacent to the base part; a ceiling surface facing the bottom surface; and a side surface extending between the bottom surface and the ceiling surface. An inclination angle of the side surface with respect to the bottom surface on a cross section perpendicular to the base part may be in a range from about 70° to about 90°.

In an embodiment, the bottom surface may have a width in a range from about 4 µm to about 10 µm on the cross section perpendicular to the base part.

In an embodiment, each of the protruding parts may have a height in a range from about 7 µm to about 15 µm and the height may be a minimum spaced distance between the bottom surface and the ceiling surface.

In an embodiment, the protruding parts may include a first protruding part and a second protruding part, which are adjacent to each other, and a minimum spaced distance between the bottom surface of the first protruding part and the bottom surface of the second protruding part may be in a range from about 4 µm to about 10 µm.

In an embodiment, the bottom surface may have a width that is different from a width of the ceiling surface.

In an embodiment, the first refractive index may range from about 1.5 to about 1.7, and a difference between the first refractive index and the second refractive index may be equal to or greater than about 0.1.

In an embodiment, the second pattern layer may be disposed between the protruding parts.

In an embodiment, a display device may include a light emitting element layer including a first electrode, a second electrode facing the first electrode, and a light emitting layer disposed between the first electrode and the second electrode; an optical pattern layer disposed on the light emitting element layer and including a first pattern layer having a first refractive index and a second pattern layer having a second refractive index less than the first refractive index; and an optical member. The optical member may be disposed between the light emitting element layer and the optical pattern layer or may be disposed on the optical pattern layer.

In an embodiment, the light emitting element layer may further include an encapsulation layer disposed on the second electrode, and the optical pattern layer may be directly disposed on the encapsulation layer.

In an embodiment, the first pattern layer may include a base part and protruding parts disposed on the base part and spaced apart from each other. Each of the protruding parts may include a bottom surface adjacent to the base part; a ceiling surface facing the bottom surface; and a side surface extending between the bottom surface and the ceiling surface. Each of the bottom surface and the ceiling surface may have a circular or polygonal shape on a cross section parallel to the base part.

In an embodiment, in each of the protruding parts, a width of the bottom surface may be in a range from about 4 µm to about 10 µm, a height that is minimum spaced distance between the bottom surface and the ceiling surface may be in a range from about 7 µm to about 15 µm, and an inclination angle of the side surface with respect to the bottom surface on a cross section perpendicular to the base part may be in a range from about 70° to about 90°.

In an embodiment, the first electrode may be a reflective electrode, and the second electrode may be a transmissive electrode or a transflective electrode.

In an embodiment, the light emitting element layer may include an organic electroluminescent element or a quantum dot light emitting element.

In an embodiment, the optical member may be a polarizing layer, and the optical pattern layer may be directly disposed on or below the polarizing layer.

In an embodiment, the optical member may be a color filter layer, and the optical pattern layer may be directly disposed on the color filter layer.

BRIEF DESCRIPTION OF THE DRAWINGS

The accompanying drawings illustrate embodiments of the invention and, together with the description, serve to explain the embodiments. In the drawings.

DETAILED DESCRIPTION OF THE EMBODIMENTS

Figure 1:
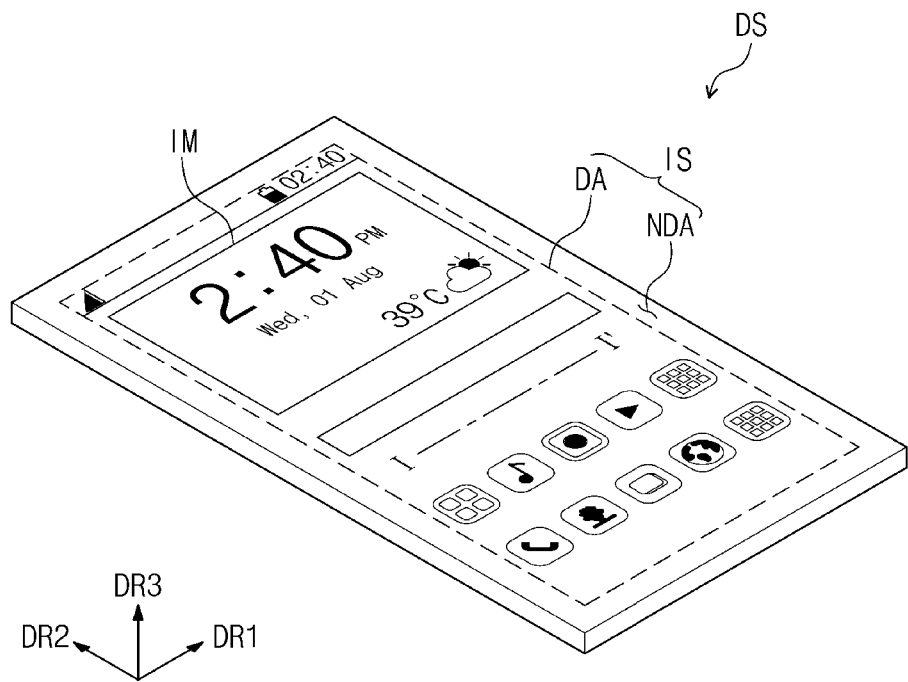
FIG. 1 is a perspective view illustrating a display device according to an embodiment.

Since the disclosure may have diverse modified embodiments, they are illustrated in the drawings and are described in the detailed description of the invention. However, this does not limit the disclosure within specific embodiments and the disclosure covers all the modifications, equivalents, and replacements within the idea and technical scope of the invention.

It will also be understood that when one component (or region, layer, portion) is referred to as being 'on', 'connected to', or 'coupled to' another component, it can be directly disposed/connected/coupled on/to the one component, or one or more intervening components may also be present.

In this application, it will be understood that when a layer, a film, a region, or a plate is "directly disposed" on another layer, film, region, or plate, further another layer, film, region, or plate can not be present therebetween. For example, a feature of being "directly disposed" may represent that two layers or two members are disposed without using an additional member such as an adhesive member.

Like reference numerals refer to like elements throughout. Also, in the figures, the thickness, ratio, and dimensions of components are exaggerated for clarity of illustration, better understanding, and ease of description thereof. However, the disclosure is not limited to the illustrated sizes and thicknesses.

The phrase "at least one of" is intended to include the meaning of "at least one selected from the group of" for the purpose of its meaning and interpretation. For example, "at least one of A and B" may be understood to mean "A, B, or A and B." When preceding a list of elements, the term, "at least one of," modifies the entire list of elements and does not modify the individual elements of the list.

The term "and/or" includes any and all combinations of one or more of the associated listed items. The terms "and" and "or" may be used in the conjunctive or disjunctive sense and may be understood to be equivalent to "and/or."

It will be understood that although the terms such as 'first' and 'second' are used herein to describe various elements, these elements should not be limited by these terms. The terms are only used to distinguish one component from other components. For example, a first element referred to as a first element in one embodiment can be referred to as a second element in another embodiment without departing from the scope of the appended claims. The terms of a singular form may include plural forms unless referred to the contrary.

Also, "under", "below", "above", "upper", and the like are used for explaining relation association of components illustrated in the drawings. The terms may be a relative concept and described based on directions expressed in the drawings.

"About" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±20%, 10%, or 5% of the stated value.

Unless otherwise defined, all terms (including technical and scientific terms) used herein have the same meaning as generally understood by those skilled in the art. Terms as defined in a commonly used dictionary should be construed as having the same meaning as in an associated technical context, and unless defined apparently in the description, the terms are not ideally or excessively construed as having formal meaning.

The meaning of 'include' or 'comprise' specifies a property, a fixed number, a step, an operation, an element, a component or a combination thereof, but does not exclude other properties, fixed numbers, steps, operations, elements, components or combinations thereof.

Hereinafter, a display device according to an embodiment will be described with reference to the accompanying drawings.

Figure 2:
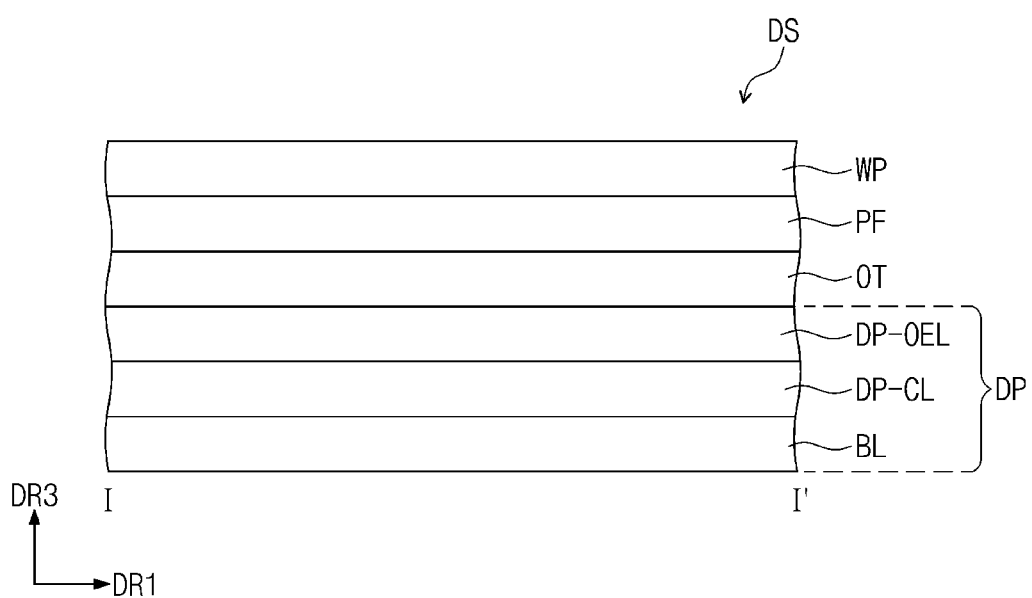
FIG. 2 is a schematic cross-sectional view illustrating the display device according to an embodiment.
Figure 3:
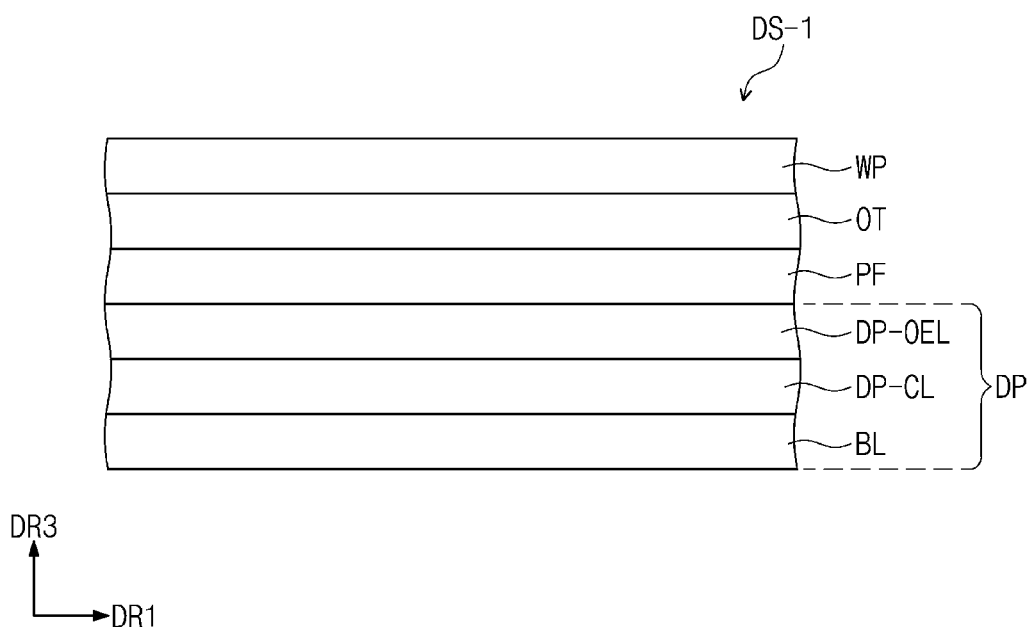
FIG. 3 is a schematic cross-sectional view illustrating a display device according to an embodiment.

FIG. 1 is a perspective view illustrating a display device DS according to an embodiment. FIG. 2 is a cross-sectional view taken along line I-I' in FIG. 1 and illustrating the display device DS according to an embodiment. FIG. 3 is a cross-sectional view illustrating a display device DS-1 according to an embodiment.

Figure 4:
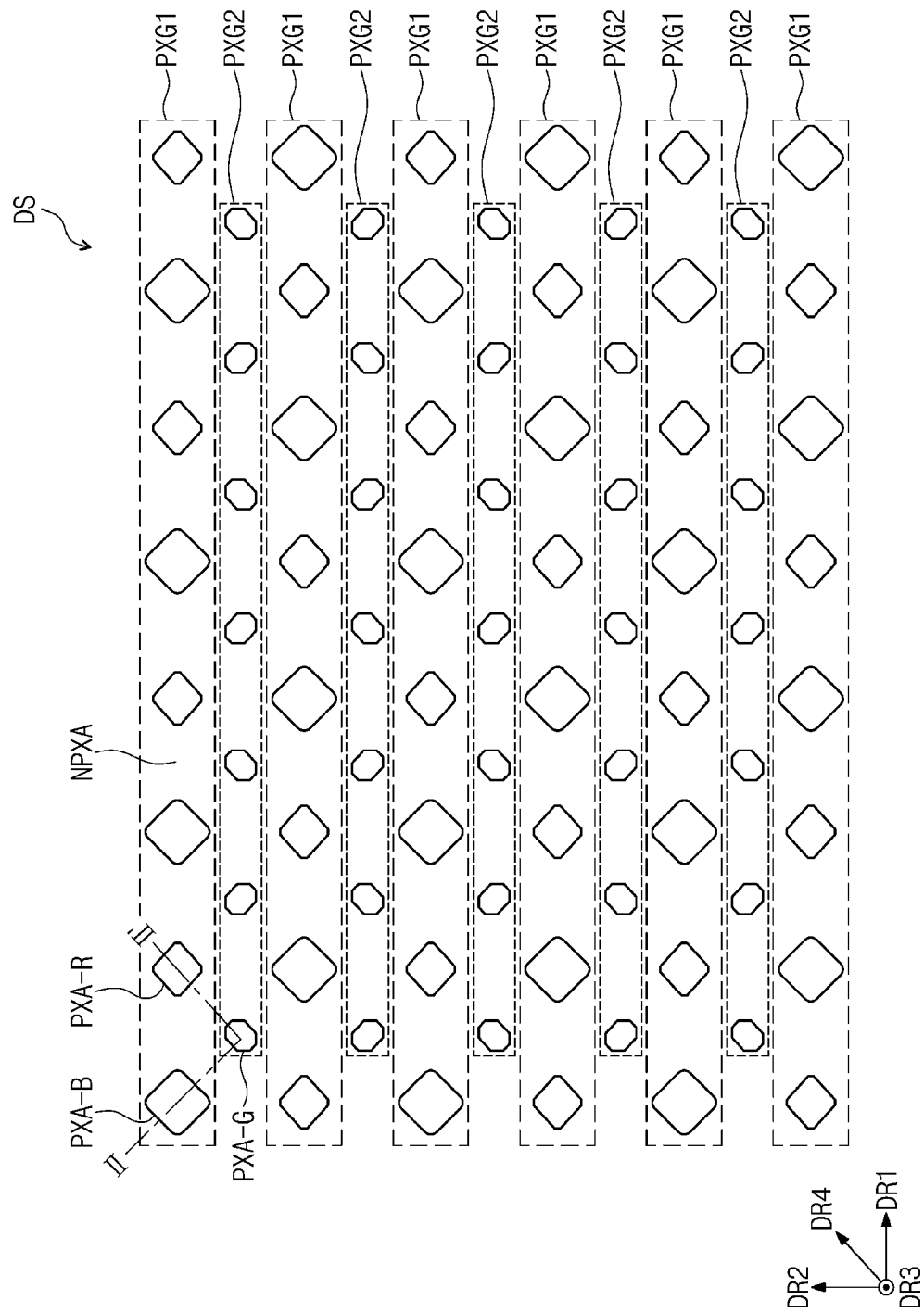
FIG. 4 is a plan view illustrating the display device according to an embodiment.
Figure 5:
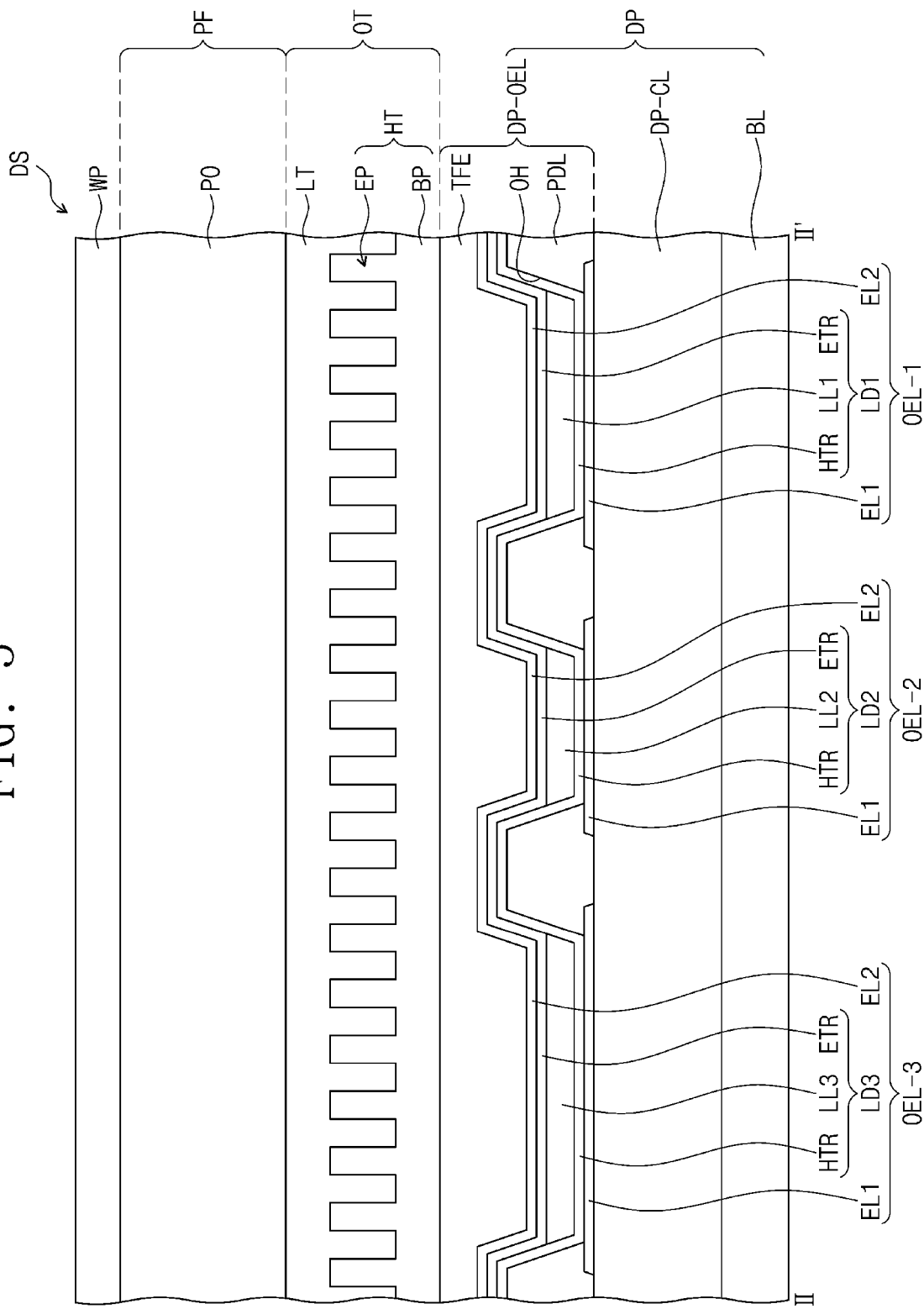
FIG. 5 is a schematic cross-sectional view taken along line II-II' of FIG. 4 and illustrating the display device.
Figure 6:
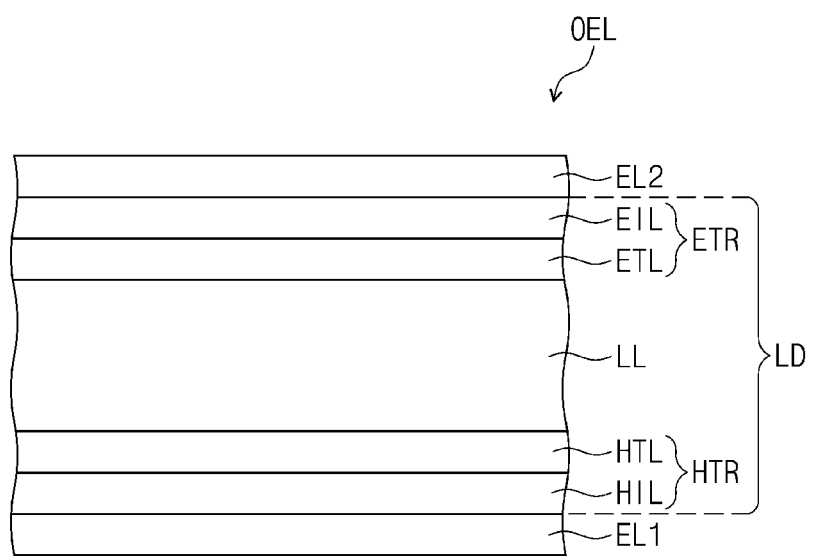
FIG. 6 is a schematic cross-sectional view illustrating a light emitting element according to an embodiment.
Figure 7:
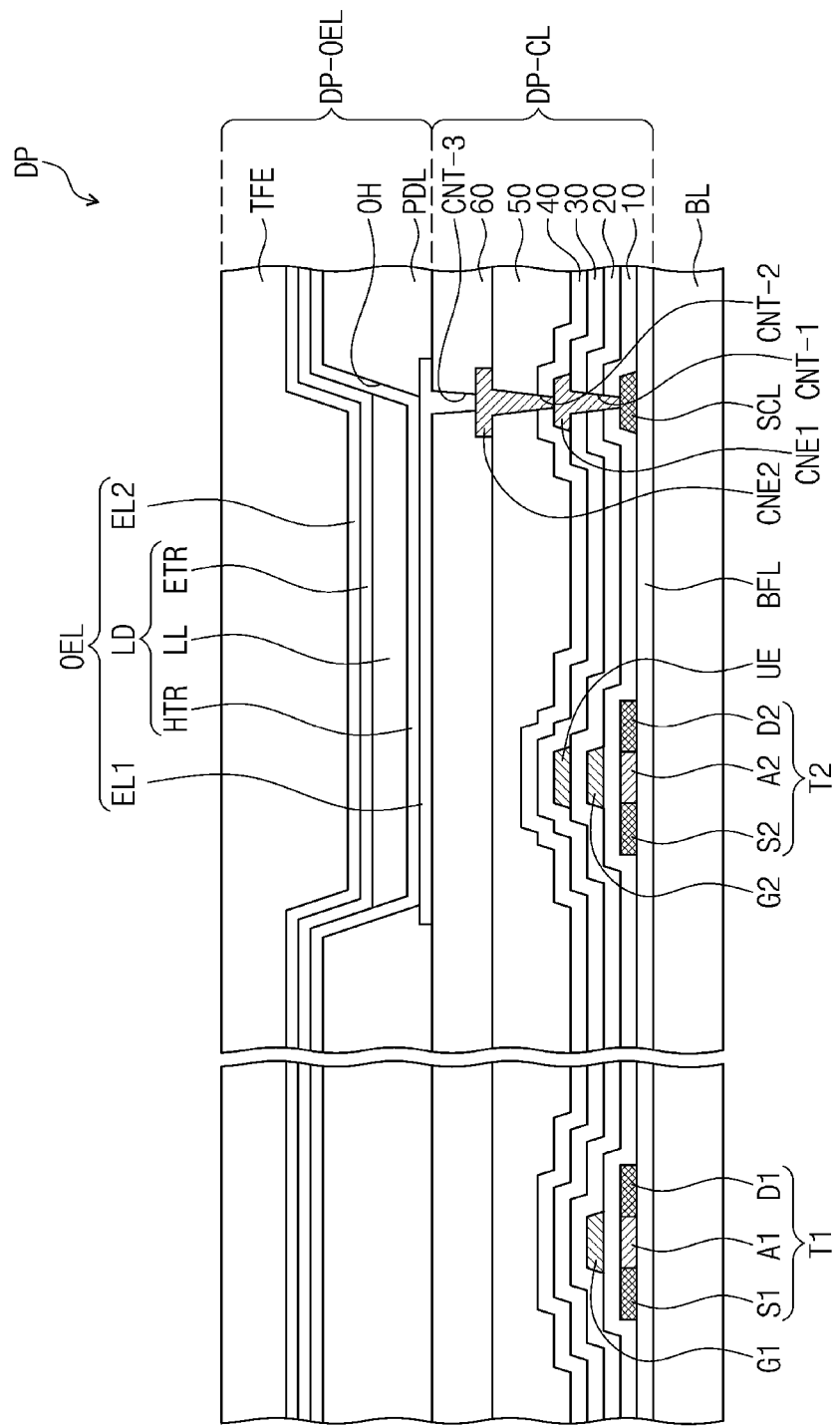
FIG. 7 is a schematic cross-sectional view illustrating a portion of the display device according to an embodiment.

FIG. 4 is a plan view illustrating a portion of the display device DS according to an embodiment, and FIG. 5 is a cross-sectional view taken along line II-II' in FIG. 4 and illustrating the display device DS. FIG. 6 is a cross-sectional view illustrating a portion of a light emitting element layer DP-OEL according to an embodiment. FIG. 7 is a cross-sectional view illustrating a portion of a display panel DP of the display device DS.

Figure 8:
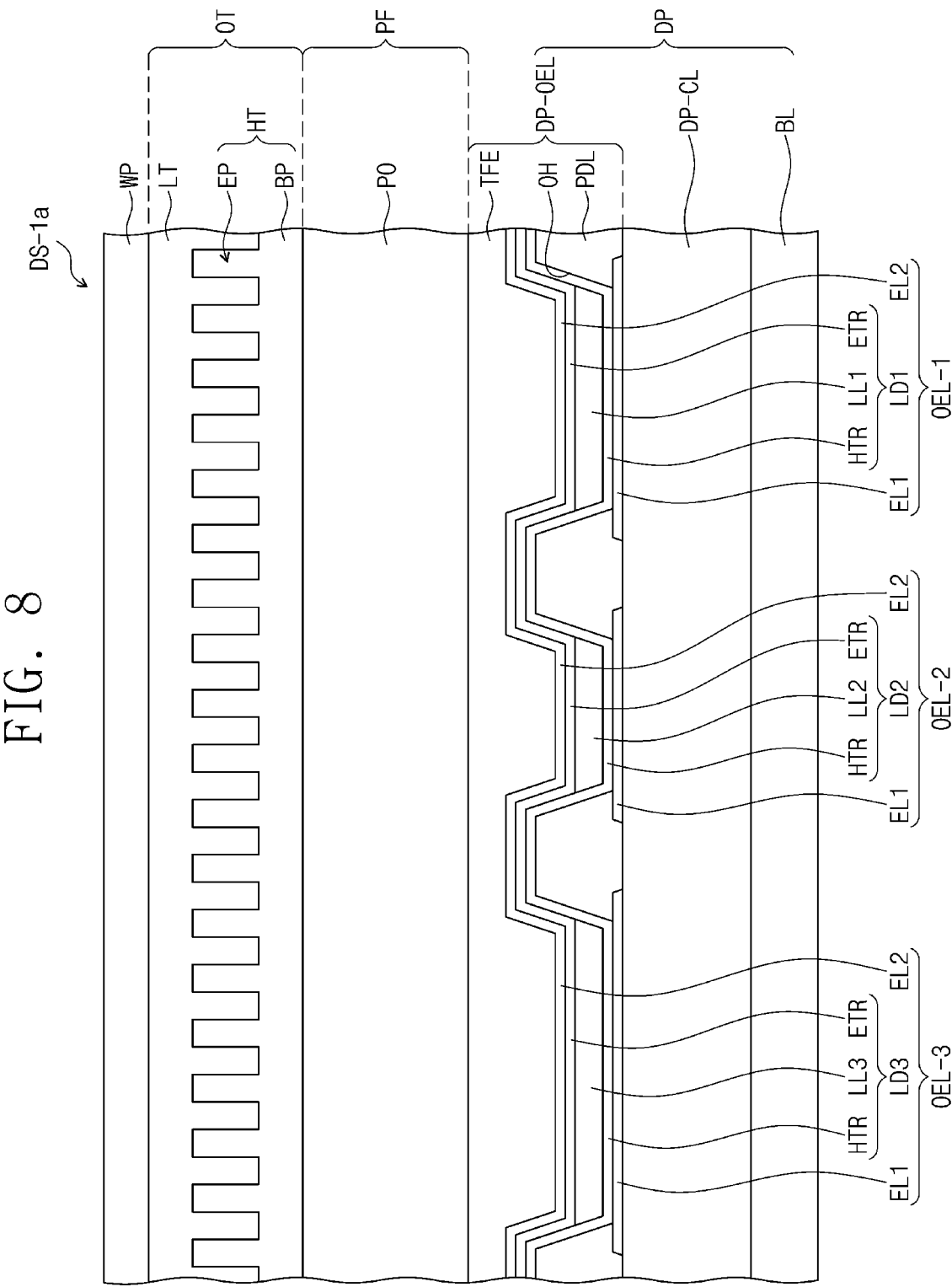
FIG. 8 is a schematic cross-sectional view illustrating a display device according to an embodiment.
Figure 9:
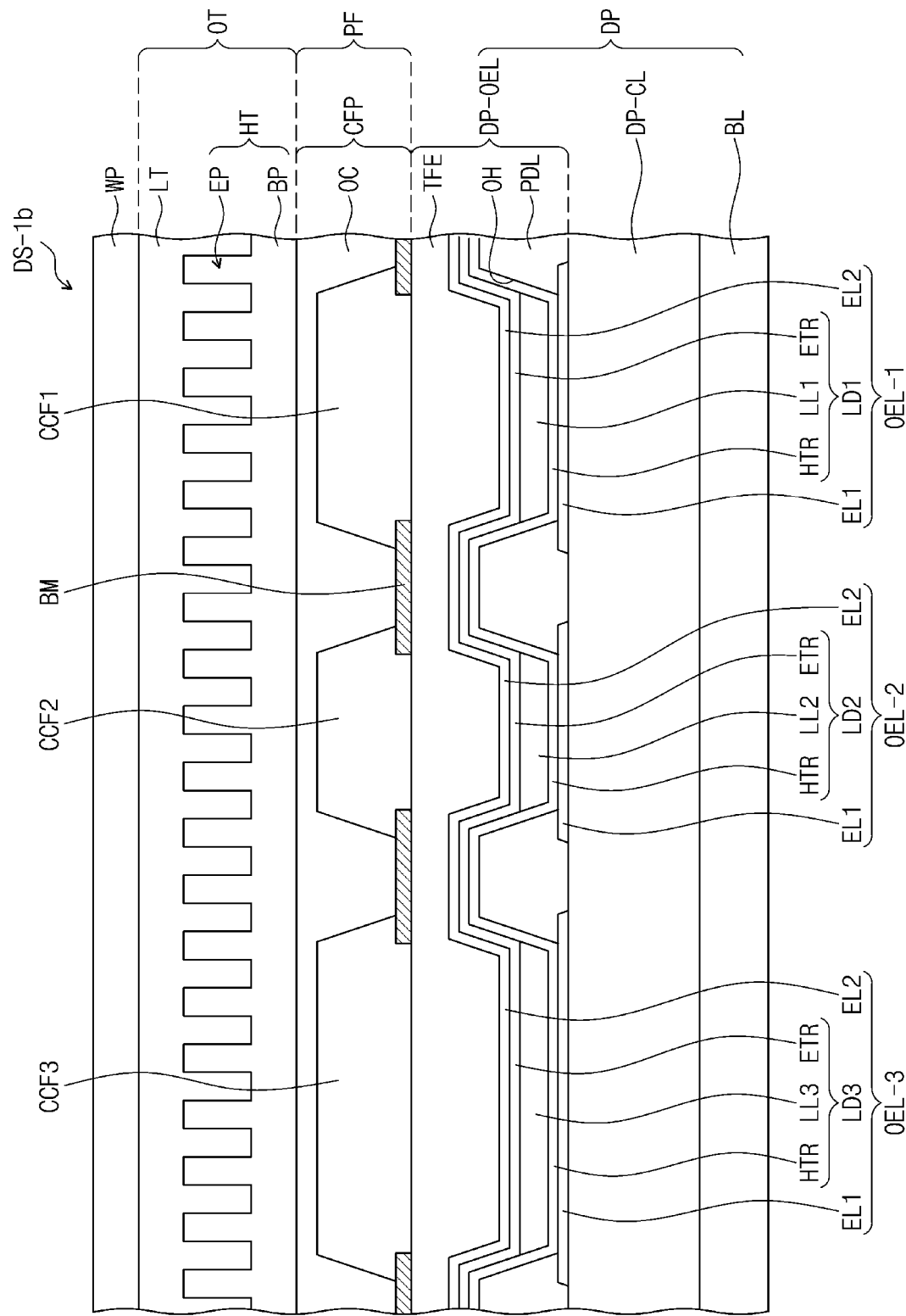
FIG. 9 is a schematic cross-sectional view illustrating a display device according to an embodiment.

FIG. 8 is a cross-sectional view illustrating a display device DS-1*a* according to an embodiment. FIG. 9 is a cross-sectional view illustrating a display device DS-1*b* according to an embodiment.

In FIG. 1, a portable electronic device is illustrated as an example of the display device DS. However, the display device DS may be used for large-sized electronic devices such as televisions, monitors, or outdoor advertisement boards and small and medium-sized electronic devices such as personal computers, notebook computers, personal digital terminals, navigation units for vehicles, game consoles, smartphones, tablet computers, and cameras. The above-described devices are disclosed herein as embodiments, and thus, the display device DS may be adopted for other electronic devices unless departing from the spirit and scope of the invention.

Referring to FIG. 1, the display device DS may display an image IM through a display surface IS. The display surface IS may include a display area DA on which the image IM is displayed and a non-display area NDA that may be adjacent to the display area DA. The non-display area NDA is an area on which an image is not displayed.

The display area DA may have a rectangular shape. The non-display area NDA may surround the display area DA. However, the embodiments are not limited thereto. For example, the display area DA and the non-display area NDA may be relatively designed in shape. Also, the non-display area NDA may not exist on a front surface of the display device DS.

The display device DS according to an embodiment may include an optical pattern layer OT disposed on a light emitting element layer DP-OEL, and the optical pattern layer OT may include a first pattern layer HT having protruding parts EP that are spaced apart from each other on a base part BP and a second pattern layer LT having a relatively low refractive index. The optical pattern layer OT contained in the display device according to an embodiment will be described in more detail when FIGS. 10 to 13 illustrating a portion of the optical pattern layer OT are described.

Referring to FIGS. 2 and 3, the display device DS and DS-1 may include a display panel DP, an optical pattern layer OT disposed on the display panel DP, an optical member PF, and a window member WP disposed on the optical pattern layer OT. The optical member PF and the optical pattern layer OT may be disposed between the display panel DP and the window member WP.

In the display device DS and DS-1 according to an embodiment, the optical pattern layer OT may be disposed above or below the optical member PF. For example, the optical pattern layer OT may be disposed directly above the optical member PF or directly below the optical member PF.

In FIG. 2, the display device DS according to an embodiment, in which the optical member PF is disposed directly above the optical pattern layer OT, is illustrated. In FIG. 3, the display device DS-1, in which the optical pattern layer OT is disposed directly above the optical member PF, is illustrated.

Referring to FIG. 4, the display device DS may include a non-light emitting area NPXA and light emitting areas PXA-R, PXA-G, and PXA-B.

The display device DS according to an embodiment may include three light emitting areas PXA-R, PXA-G, and PXA-B emitting red light, green light, and blue light, respectively. Also, the light emitting areas PXA-R, PXA-G, and PXA-B may have different areas from each other. Although an embodiment of the display device DS including the three light emitting areas PXA-R, PXA-G, and PXA-B is illustrated in FIG. 4, the embodiments are not limited thereto.

FIG. 5 is a cross-sectional view taken along line II-II' of FIG. 4 and illustrating the display device DS according to an embodiment. Referring to FIG. 5, the optical pattern layer OT may be disposed below the optical member PF, and the light emitting element layer DP-OEL may be disposed below the optical pattern layer OT.

Referring to FIGS. 2 to 7, the display panel DP according to an embodiment may include a light emitting layer DP-OEL, a circuit layer DP-CL, and a base layer BL. For example, the display panel DP may include the base layer BL, and the circuit layer DP-CL disposed on the base layer BL, and the light emitting element layer DP-OEL disposed on the circuit layer DP-CL.

The base layer BL may provide a base surface on which the light emitting element layer DP-OEL is disposed. The base layer BL may be a glass substrate, a metal substrate, and/or a plastic substrate. However, the embodiments are not limited thereto. For example, the base layer BL may be an inorganic layer, an organic layer, or a composite material layer.

The circuit layer DP-CL may include transistors T1 and T2. Each of the transistors T1 and T2 may include a source, an active, and a drain. For example, the circuit layer DP-CL may include a switching transistor T1 and a driving transistor T2, which are for driving a light emitting element OEL-1, OEL-2, and OEL-3.

FIG. 7 is a cross-sectional view illustrating the display panel DP according to an embodiment. FIG. 7 illustrates the circuit layer DP-CL including the transistors T1 and T2 in more detail. Referring to FIG. 7, the circuit layer DP-CL may include a first transistor T1 and a second transistor T2, which are disposed on a buffer layer BFL, and a connection signal line SCL. The first transistor T1 may include a source S1, an active A1, and a drain D1. The second transistor T2 may include a source S2, an active A2, and a drain D2. The source S1 and S2 and the drain D1 and D2 may extend in opposite directions from the active A1 and A2 on a cross-section.

A first insulation layer 10 may be disposed on the buffer layer BFL. The first insulation layer 10 may be an inorganic layer and/or an organic layer and have a single-layer or multilayer structure. The first insulation layer 10 may include at least one of an aluminum oxide, a titanium oxide, a silicon oxide, a silicon oxynitride, a zirconium oxide, and a hafnium oxide. In addition to the first insulation layer 10, an insulation layer of the circuit layer DP-CL may be an inorganic layer, an organic layer, or a composite material layer and have a single-layer or multilayer structure. The inorganic layer may include at least one of the above-described materials.

Gate G1 and G2 may be disposed on the first insulation layer 10. The gate G1 and G2 may be a portion of a metal pattern. The gate G1 and G2 may independently overlap the active A1 and A2.

A second insulation layer 20 covering the gate G1 and G2 may be disposed on the first insulation layer 10.

An upper electrode UE may be disposed on the second insulation layer 20. The upper electrode UE may overlap the gate G2 of the second transistor T2.

A third insulation layer 30 covering the upper electrode UE may be disposed on the second insulation layer 20. A first connection electrode CNE1 may be disposed on the third insulation layer 30. The first connection electrode CNE1 may be electrically connected to the connection signal line SCL through a contact hole CNT-1 passing through the first to third insulation layers 10 to 30.

A fourth insulation layer 40 covering the first connection electrode CNE1 may be disposed on the third insulation layer 30. A fifth insulation layer 50 may be disposed on the fourth insulation layer 40. A second connection electrode CNE2 may be disposed on the fifth insulation layer 50. The second connection electrode CNE2 may be electrically connected to the first connection electrode CNE1 through a contact hole CNT-2 passing through the fourth and fifth insulation layers 40 and 50.

A sixth insulation layer 60 covering the second connection electrode CNE2 may be disposed on the fifth insulation layer 50. A first electrode EL1 may be disposed on the sixth insulation layer 60. The first electrode EL1 may be electrically connected to the second connection electrode CNE2 through a contact hole CNT-3 passing through the sixth insulation layer 60.

The light emitting element layer DP-OEL may be disposed on the circuit layer DP-CL and include a light emitting element OEL and an encapsulation layer TFE.

The light emitting element layer DP-OEL may include light emitting elements OEL-1, OEL-2, and OEL-3 and a pixel defining layer PDL that distinguishes the light emitting elements OEL-1, OEL-2, and OEL-3.

In FIG. 6, a structure of the light emitting elements OEL-1, OEL-2, and OEL-3 of the light emitting element layer DP-OEL is representatively illustrated as an example.

Referring to FIG. 6, the light emitting element OEL may include a first electrode EL1 and a second electrode EL2, which face each other, and a functional layer LD disposed between the first electrode EL1 and the second electrode EL2. The functional layer LD may include a hole transport region HTR, a light emitting layer LL, and an electron transport region ETR. The light emitting element OEL may include the first electrode EL1, the hole transport region HTR disposed on the first electrode EL1, the light emitting layer LL disposed on the hole transport region HTR, the electron transport region ETR disposed on the light emitting layer LL, and the second electrode EL2 disposed on the electron transport region ETR. The hole transport region HTR may include a hole injection layer HIL and a hole transport layer HTL, and the electron transport region ETR may include an electron injection layer EIL and an electron transport layer ETL.

In the display device DS according to an embodiment, the first electrode EL1 of the light emitting element OEL may be a reflective electrode, and the second electrode EL2 may be a transmissive electrode or a transflective electrode. For example, in the display device DS according to an embodiment, the light emitting element OEL may emit light forward toward the display surface IS.

In the light emitting element OEL according to an embodiment, the first electrode EL1 may be made of a metal alloy or a conductive compound. The first electrode EL1 may be an anode. For example, when the first electrode EL1 is the reflective electrode, the first electrode EL1 may include Ag, Mg, Cu, Al, Pt, Pd, Au, Ni, Nd, Ir, Cr, Li, Ca, LiF/Ca, LiF/Al, Mo, Ti, or a compound or mixture (e.g., a mixture of Ag and Mg) thereof. Alternatively, the first electrode EL1 may have a multilayer structure including a reflective layer or a transflective layer, which is made of the above-listed materials, and a transparent conductive layer made of an indium tin oxide (ITO), an indium zinc oxide (IZO), a zinc oxide (ZnO), or an indium tin zinc oxide (ITZO). For example, the first electrode EL1 may be a multilayer metal layer and have a structure in which metal layers of ITO/Ag/ITO are laminated.

The hole transport region HTR may include a hole injection layer HIL and a hole transport layer HTL, and a well-known hole injection material and a well-known hole transport material may be used for the hole injection layer HIL and the hole transport layer HTL, respectively. Also, when the electron transport region ETR includes an electron injection layer EIL and an electron transport layer ETL, a well-known electron injection material and a well-known electron transport material may be used for the electron injection layer EIL and the electron transport layer ETL, respectively.

Also, the light emitting element OEL according to an embodiment may include only one of the hole injection layer HIL and the hole transport layer HTL or only one of the electron injection layer EIL and the electron transport layer ETL.

The light emitting layer LL may include an organic electroluminescent material or a quantum dot. The embodiments are not specifically limited to the material of the light emitting layer LL when the material is typically used. For example, the light emitting layer LL may be made of materials that emit red, green, and blue light, and include a phosphor material and a fluorescent material. Also, the light emitting layer LL may include a well-known host material or a well-known dopant material.

When the light emitting layer LL includes a quantum dot, a core of the quantum dot may be selected from the group consisting of a Group II-VI compound, a Group III-V compound, a Group IV-VI compound, a Group IV element, a Group IV compound, and combinations thereof.

The hole transport region HTR may be formed by using various methods such as a vacuum deposition method, a spin coating method, a casting method, a Langmuir-Blodgett (LB) method, an inject printing method, a laser printing method, and a laser induced thermal imaging (LITT) method.

The second electrode EL2 may be disposed on the electron transport region ETR. The second electrode EL2 may be a cathode. The second electrode EL2 may be made of a metal alloy or a conductive compound. The second electrode EL2 may be a transmissive electrode or a transflective electrode. When the second electrode EL2 is the transmissive electrode, the second electrode EL2 may be made of a metal oxide such as, e.g., an indium tin oxide (ITO), an indium zinc oxide (IZO), a zinc oxide (ZnO), or an indium tin zinc oxide (ITZO).

When the second electrode EL2 is the transflective electrode, the second electrode EL2 may include Ag, Mg, Al, Pt, Pd, Au, Ni, Nd, Ir, Cr, Li, Ca, LiF/Ca, LiF/Al, Mo, Ti, or a compound or mixture (e.g., a mixture of Ag and Mg) thereof. Alternatively, the second electrode EL2 may have a multilayer structure including a reflective layer or a transflective layer, which is made of the above-listed materials, and a transparent conductive layer made of an indium tin oxide (ITO), an indium zinc oxide (IZO), a zinc oxide (ZnO), or an indium tin zinc oxide (ITZO).

Features of the light emitting element OEL described with reference to FIG. 6 may be applied to the light emitting elements OEL-1, OEL-2, and OEL-3 in FIG. 5 or the like in the same manner.

For example, each of the light emitting elements OEL-1, OEL-2, and OEL-3 may include a first electrode EL1, a second electrode EL2, and a functional layer LD1, LD2, and LD3 disposed between the first electrode EL1 and the second electrode EL2. Each of the light emitting elements OEL-1, OEL-2, and OEL-3 may include a first electrode EL1, a hole transport region HTR disposed on the first electrode EL1, a light emitting layer LL1, LL2, and LL3 disposed on the hole transport region HTR, an electron transport region ETR disposed on the light emitting layer LL1, LL2, and LL3, and a second electrode EL2 disposed on the electron transport region ETR. The light emitting layers LL1, LL2, and LL3 may be distinguished by a pixel defining layer PDL.

Although the hole transport region HTR is provided as a common layer to overlap the pixel defining layer PDL in FIG. 5, the embodiments are not limited thereto. For example, the hole transport region HTR may be provided between the pixel defining layers PDL. For example, the hole transport region HTR may be provided between the pixel defining layers PDL by using an inkjet printing method.

The pixel defining layer PDL may be made of a polymer resin. For example, the pixel defining layer PDL may include a polyacrylate-based resin or a polyimide-based resin. The pixel defining layer PDL may further include an inorganic material in addition to the polymer resin.

Alternatively, the pixel defining layer PDL may be made of an inorganic material. For example, the pixel defining layer PDL may include silicon nitride (SiNx), silicon oxide (SiOx), or silicon oxynitride (SiOxNy).

An encapsulation layer TFE may be disposed on the light emitting elements OEL-1, OEL-2, and OEL-3. The light emitting elements OEL-1, OEL-2, and OEL-3 may be sealed by the encapsulation layer TFE. The encapsulation layer TFE may be a thin-film encapsulation layer. The encapsulation layer TFE may protect the light emitting elements OEL-1, OEL-2, and OEL-3. The encapsulation layer TFE may protect a top surface of the second electrode EL2 disposed in an opening OH.

According to an embodiment, an optical pattern layer OT may be disposed above or below an optical member PF.

Figure 10:
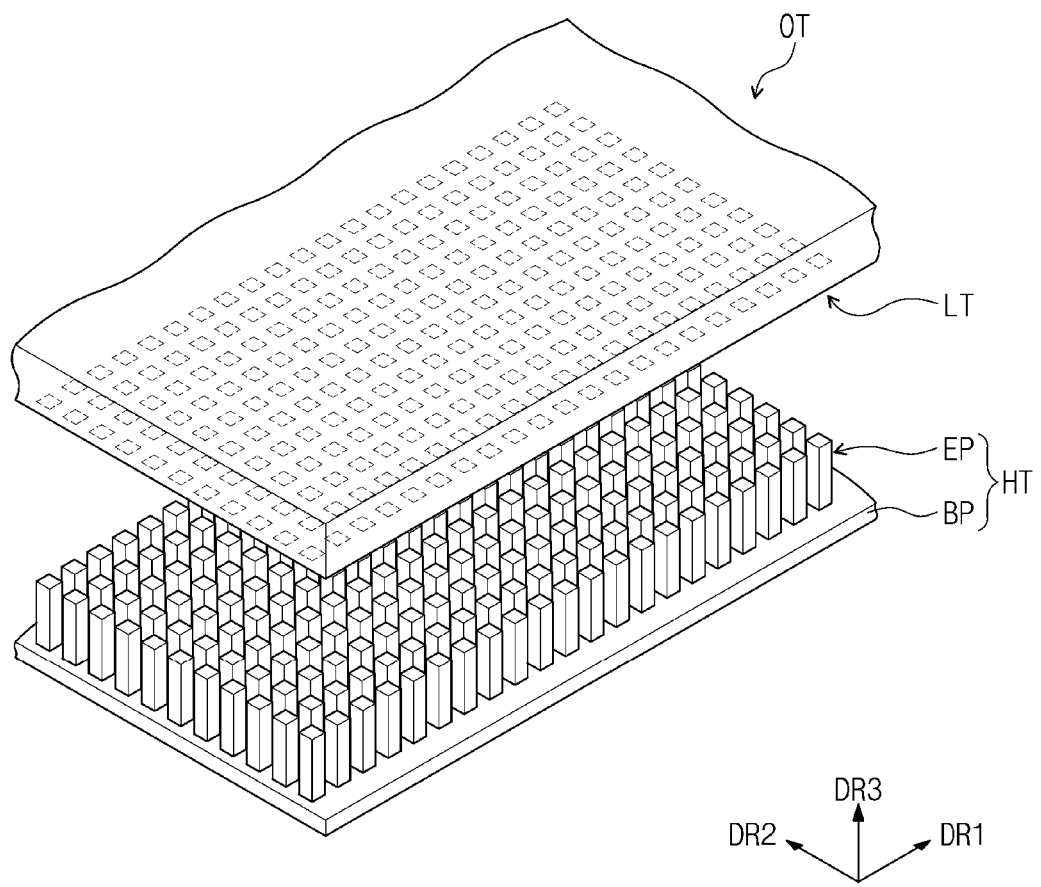
FIG. 10 is an exploded perspective view illustrating an optical pattern layer according to an embodiment.
Figure 11:
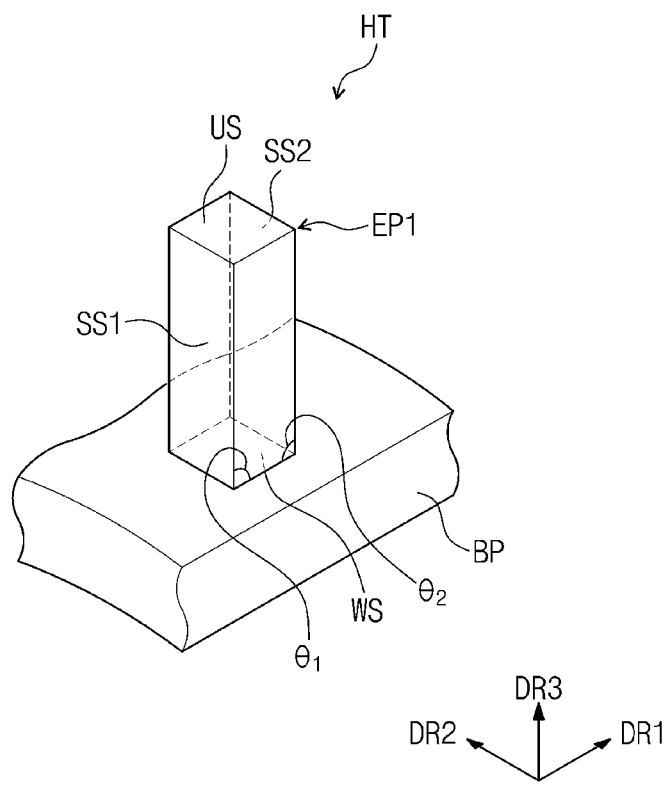
FIG. 11 is a perspective view illustrating a portion of the optical pattern layer according to an embodiment.
Figure 12:
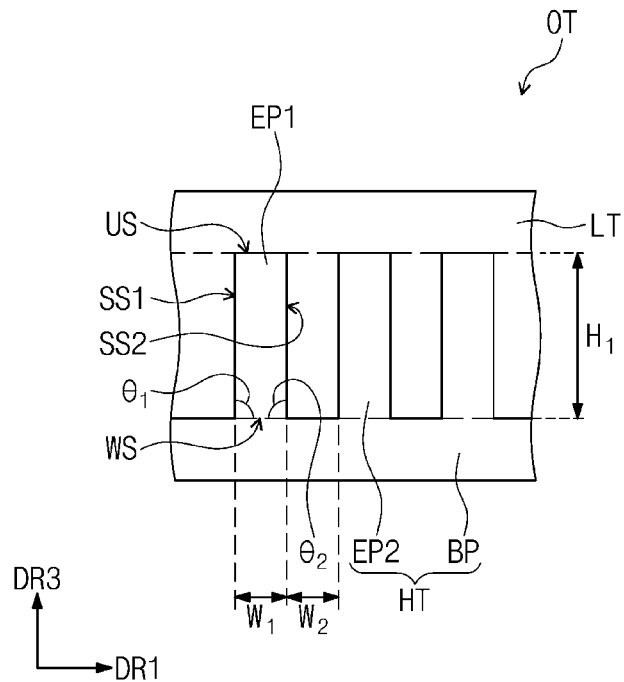
FIG. 12 is a schematic cross-sectional view illustrating a portion of the optical pattern layer according to an embodiment.
Figure 13:
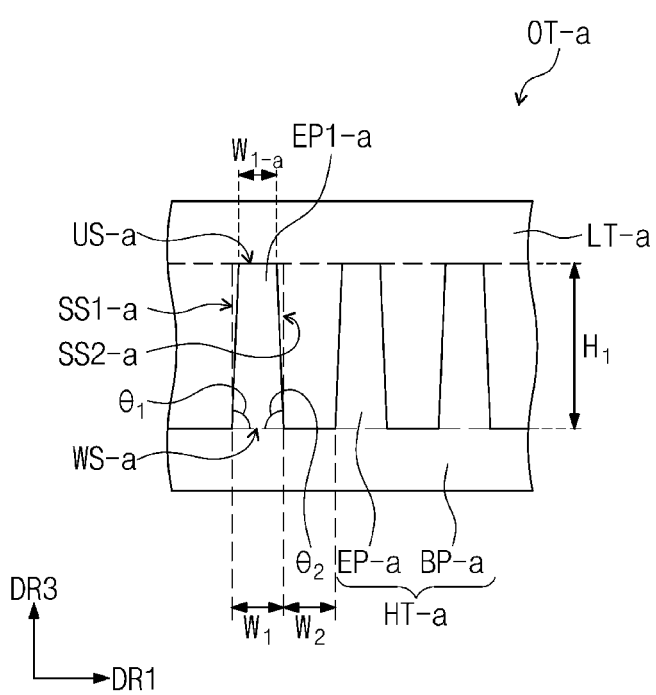
FIG. 13 is a schematic cross-sectional view illustrating a portion of an optical pattern layer according to an embodiment.

FIG. 10 is an exploded perspective view illustrating an optical pattern layer OT according to an embodiment. FIG. 11 is a perspective view illustrating a first pattern layer HT according to an embodiment. FIGS. 12 and 13 are cross-sectional views illustrating an optical pattern layer OT and OT-a according to an embodiment.

According to an embodiment, the optical pattern layer OT may include a first pattern layer HT and a second pattern layer LT.

The optical pattern layer OT may include the first pattern layer HT disposed adjacent to the display panel DP (refer to FIG. 5) and having a first refractive index and the second pattern layer LT disposed on the first pattern layer HT and having a second refractive index less than the first refractive index.

Here, in the optical pattern layer OT according to an embodiment, the second pattern layer LT may function as an adhesive layer. The second pattern layer LT may be disposed directly between a polarizing layer PO and a window member WP. For example, in a display device DS-1a according to an embodiment, the optical pattern layer OT may function to couple the polarizing layer PO and the window member WP.

A first pattern layer HT may have a first refractive index in a range from about 1.5 to about 1.7. A second pattern layer LT may have a relatively low second refractive index, and a difference between the first pattern layer HT and the second pattern layer LT may be equal to or greater than about 0.1. For example, the second pattern layer LT may have a refractive index in a range from about 1.3 to about 1.6.

According to an embodiment, a difference between the first refractive index and the second refractive index may be in a range from about 0.1 to about 0.2. Here, the second refractive index may be in a range from about 1.3 to about 1.6.

The first pattern layer HT having the first refractive index may include a base part BP and protruding parts EP spaced apart from each other on the base part BP. The second pattern layer LT may be a planarization layer of the first pattern layer HT. For example, the second pattern layer LT may be disposed on the first pattern layer HT and filled between the protruding parts EP.

Referring to FIGS. 10 to 13, the first pattern layer HT may include a base part BP and protruding parts EP vertically disposed on the base part BP and spaced apart from each other. Each of the protruding parts EP may have a cylindrical or prismatic shape protruding from the base part BP. For example, the prismatic shape may be a polygonal cylinder having a polygonal shape on a cross-section defined by a first directional axis DR1 and a second directional axis DR2 and extending in a third directional axis DR3. For example, each of the protruding parts EP may have a pentagonal or hexagonal shape. Alternatively, each of the protruding parts EP may have a cylindrical shape.

Each of the protruding parts EP may include a bottom surface WS adjacent to the base part BP, a ceiling surface US facing the bottom surface WS, and a side surface SS1 and SS2 extending between the bottom surface WS and the ceiling surface US. Here, the protruding part EP may have a cross-section parallel to the base part BP having a circular or polygonal shape. Although only a rectangular cylinder shape is illustrated in FIGS. 10 to 13, the embodiments are not limited thereto. Each of the protruding parts EP may independently have a cylindrical or prismatic shape.

For example, when each of the bottom surface WS and the ceiling surface US has the same circular shape, and the cross-section of the protruding part EP parallel to the base part BP also has a circular shape, the protruding part EP may have a cylindrical shape. Alternatively, when each of the bottom surface WS and the ceiling surface US has a rectangular shape, and the cross-section of the protruding part EP parallel to the base part BP also has a rectangular shape, the protruding part EP may have a rectangular cylinder shape.

A bottom surface WS, a ceiling surface US, and a side surface SS1 of a first protruding part EP that is one of the protruding parts may be referred to as a first bottom surface, a first ceiling surface, and a first side surface, respectively.

The first protruding part EP1 of the optical pattern layer OT in FIG. 12 may have a rectangular shape on a cross-section parallel to a plane defined by the first directional axis DR1 and the third directional axis DR3. An inclination angle $\theta_1$, with respect to the first bottom surface WS, of the first side surface SS1 of the first protruding part EP1, which defines a first side of the rectangular shape on the cross-section, may be about 90°. Also, an inclination angle $\theta_2$, with respect to the first bottom surface WS, of the other side surface SS2 of the first protruding part EP1, which face the first side surface SS1 on the cross-section, may be about 90°. Each of the first inclination angle $\theta_1$ and the second inclination angle $\theta_2$ may be substantially approximate to about 90°.

The first protruding part EP1 may have a height $H_1$ in a range from about 7 μm to about 15 μm. The height $H_1$ may be referred to as a length extending in a normal direction from the first bottom surface WS to the first ceiling surface US. For example, the height $H_1$ may be a length simultaneously perpendicular to the first bottom surface WS and the first ceiling surface US and parallel to the third directional axis DR3.

The protruding parts EP may include a first protruding part EP1 and a second protruding part EP2, which are adjacent to each other, and a minimum spaced distance $W_2$ between the first protruding part EP1 and the second protruding part EP2 may be in a range from about 4 μm to about 10 μm. A width $W_1$ of the bottom surface WS may be the same as the minimum spaced distance $W_2$ between the protruding parts EP1 and EP2.

According to an embodiment, the first bottom surface WS may have the width $W_1$ in a range from about 4 μm to about 10 μm in a view of a cross-section perpendicular to the base part BP. The width $W_1$ of the first bottom surface WS may be different from a width $W_{1-a}$ of the first ceiling surface US.

When compared with the width $W_1$ of the first ceiling surface US of the first protruding part EP1 of the optical pattern layer OT according to an embodiment in FIG. 12, an optical pattern layer OT-a according to an embodiment in FIG. 13 may have a reduced width $W_{1-a}$ of a ceiling surface US-a of a protruding part EP1-a. When each of inclination angles $θ_1$ and $θ_2$ of the protruding part EP1-a is less than about 90°, the width $W_{1-a}$ of a ceiling surface US-a of may have a value less than a width $W_1$ of a bottom surface WS-a. For example, the width $W_{1-a}$ of the ceiling surface US-a may be equal to or less than the width $W_1$ of the bottom surface WS-a.

In an embodiment, three to five protruding parts EP may be provided in correspondence to each of the light emitting elements OEL-1, OEL-2, and OEL-3 (refer to FIG. 5). As the protruding parts EP are disposed, light may be effectively scattered.

In each of the protruding parts EP according to an embodiment, a width $W_1$ of the bottom surface WS may be in a range from about 4 μm to about 10 μm, a height $H_1$ that is a minimum spaced distance between the bottom surface WS and the ceiling surface US may be in a range from about 7 μm to about 15 μm, an inclination angle $θ_1$ and $θ_2$ of a side surface SS1 and SS2 with respect to the bottom surface WS in a view of a cross-section perpendicular to the base part BP may be in a range from about 70° to about 90°, and a minimum spaced distance $W_2$ between the protruding parts EP, which are adjacent to each other, may be in a range from about 4 μm to about 10 μm.

The display device DS including the optical pattern layer OT in which the protruding part EP having an optimized shape according to an embodiment may improve a color change phenomenon according to a side viewing angle and minimize reduction in front efficiency to show an improved display quality.

Referring to FIGS. 5 to 9 again, the optical member PF may be a polarizing layer PO or a color filter layer CFP. The optical member PF may block external light provided to the display panel DP from the outside of the display device DS. The optical member PF may block a portion of the external light.

In FIG. 5, the optical pattern layer OT is disposed below the polarizing layer PO. FIGS. 8 and 9 are cross-sectional views illustrating a display device DS-1a and DS-1b according to an embodiment. In FIG. 8, unlike as illustrated in FIG. 5, an optical pattern layer OT is disposed above a polarizing layer PO. In FIG. 9, unlike as illustrated in FIGS. 5 and 8, an optical pattern layer OT is disposed above a color filter layer CFP.

The polarizing layer PO may include a linear polarizer. The linear polarizer may linearly polarize provided light in one direction. The linear polarizer may be a film-type polarizer including an elongated polymer film. For example, the elongated polymer film may be an elongated polyvinyl-alcohol-based film. Also, the linear polarizer may be a coating-type polarizing layer.

The color filter layer CFP may include color filters CCF1, CCF2, and CCF3 and an organic layer OC protecting the color filters CCF1, CCF2, and CCF3. The color filters CCF1, CCF2, and CCF3 may be spaced apart from each other on a plane.

A light shielding part BM may be disposed between the color filters CCF1, CCF2, and CCF3, which are spaced apart from each other, and the light shielding part BM may distinguish a boundary between the adjacent color filters CCF1, CCF2, and CCF3.

The organic layer OC disposed on the color filters CCF1, CCF2, and CCF3 may be transparent. The organic layer OC may be made of a polymer resin.

As shown below, Tables 1 to 3 are obtained by evaluating a degree of improvement in display quality of the display device DS according to an embodiment. An efficiency and a color difference Δu'v' are measured under conditions in which the width $W_1$ and height $H_1$ of the first protruding part EP1, the minimum spaced distance $W_2$ between the first protruding part EP1 and the second protruding part EP2, which are adjacent to each other, and the inclination angles $θ_1$ and $θ_2$ are different. The efficiency is obtained by measuring light emitted from a front surface. The efficiency represents a relatively comparative value when a front efficiency in a comparative example excluding the optical pattern layer is about 100%. The color difference represents a value having a greatest difference on the basis of a value at an angle of about 0° by measuring a color change degree when a side viewing angle ranges from about 0° to about 60°. The display device in the comparative example excludes the optical pattern layer, and the display device in embodiments includes the optical pattern layer according to an embodiment. Evaluations are performed in a state in which other conditions are the same as each other except for whether the optical pattern layer is contained.

TABLE 1

| Classification | $H_1$ (μm) | $W_1$ (μm) | $W_2$ (μm) | $θ_1, θ_2$ (°) | Efficiency (%) | Color difference (Δu'v') |
|---|---|---|---|---|---|---|
| Comparative example 1 | — | — | — | — | 100.0 | 0.0122 |
| Embodiment 1 | 10 | 8 | 4 | 90 | 100.0 | 0.0058 |
| Embodiment 2 | | | | 85 | 96.8 | 0.0062 |
| Embodiment 3 | | | | 80 | 93.1 | 0.0064 |
| Embodiment 4 | | | | 75 | 89.1 | 0.0059 |
| Embodiment 5 | | | | 70 | 84.9 | 0.0058 |
| Embodiment 6 | | | | 65 | 80.5 | 0.0067 |

Table 1 shows results obtained by evaluating a display quality according to an inclination angle $θ_1$ and $θ_2$ of the first protruding part EP1. The comparative example 1 is a display device excluding an optical pattern layer. The embodiments 1 to 6 show an efficiency and a color difference in case that the inclination angle $θ_1$ and $θ_2$ is varied from about 65° to about 90° when the height $H_1$ is about 10 μm, the width $W_1$ of the bottom surface is about 8 μm, the minimum spaced distance $W_2$ between the first protruding part EP1 and the second protruding part EP2 adjacent thereto is about 4 µm. Referring to Table 1, it may be known that as the inclination angle $\theta_1$ and $\theta_2$ increases from about 65° to about 90°, the front efficiency approaches about 100%. For example, it may be known that the front efficiency improves as a shape of the protruding part approaches a rectangular shape.

Also, it may be known that the color differences of the embodiments 1 to 6 have improved values at the inclination angle $\theta_1$ and $\theta_2$ in a range from about 65° to about 90° when compared with results of the comparative example 1. For example, as the color difference decreases, the display quality according to the side viewing angle may improve. The embodiments 1 to 6 including the optical pattern layer according to an embodiment may be reduced in color change phenomenon according to the side viewing angle when compared with the comparative example 1 excluding the optical pattern layer. Although the front efficiency decreases in some embodiments, the color difference has an improved value.

For example, it may be known that a reduction rate of the front efficiency decreases as the inclination angle $\theta_1$ and $\theta_2$ increases under the condition in which the width $W_1$ and height $H_1$ of the first protruding part EP1 and the minimum spaced distance $W_2$ between the first protruding part EP1 and the second protruding part EP2 adjacent thereto are equal. It may be known that each of the efficiency and the color difference has a satisfactory value at the inclination angle $\theta_1$ and $\theta_2$ in a range from about 70° to about 90° when other conditions are the same as each other.

TABLE 2

| Classification | $\theta_1, \theta_2$ (°) | $H_1$ (µm) | $W_1$ (µm) | $W_2$ (µm) | Efficiency (%) | Color difference ($\Delta u'v'$) |
|---|---|---|---|---|---|---|
| Comparative example 1 | — | — | — | — | 100.0 | 0.0122 |
| Embodiment 1 | 85 | 10 | 6 | 6 | 95.4 | 0.0068 |
| Embodiment 2 | | | 8 | 4 | 96.8 | 0.0062 |
| Embodiment 3 | | | 10 | 2 | 97.2 | 0.0064 |

Table 2 shows results obtained by performing an evaluation under a condition in which each of the width $W_1$ of the first protruding part EP1 and the minimum spaced distance $W_2$ between the first protruding part EP1 and the second protruding part EP2 adjacent thereto is varied, and the inclination angle $\theta_1$ and $\theta_2$ of about 85° and the height $H_1$ of about 10 µm are equal. At the same time, while a sum of the width $W_1$ of the first protruding part EP1 and the minimum spaced distance $W_2$ between the first protruding part EP1 and the second protruding part EP2 adjacent thereto is constantly maintained to about 12 µm, the efficiency and the color difference are measured. When results of the embodiments 1 to 3 are reviewed, the efficiency and the color difference are not remarkably varied under the condition in which the sum of the width $W_1$ of the first protruding part EP1 and the minimum spaced distance $W_2$ between the first protruding part EP1 and the second protruding part EP2 adjacent thereto is about 12 µm.

TABLE 3

| Classification | $\theta_1, \theta_2$ (°) | $W_1$ (µm) | $W_2$ (µm) | $H_1$ (µm) | Efficiency (%) | Color difference ($\Delta u'v'$) |
|---|---|---|---|---|---|---|
| Comparative example 1 | — | — | — | — | 100.0 | 0.0122 |
| Embodiment 1 | 85 | 8 | 4 | 5 | 97.4 | 0.0094 |
| Embodiment 2 | | | | 10 | 96.8 | 0.0062 |
| Embodiment 3 | | | | 15 | 95.9 | 0.0048 |

Table 3 shows results obtained by performing an evaluation under a condition in which the width $W_1$ of the first protruding part EP1 and the minimum spaced distance $W_2$ between the first protruding part EP1 and the second protruding part EP2 adjacent thereto and the inclination angle $\theta_1$ and $\theta_2$ are equal, and the height $H_1$ is different. Referring to evaluation results of the embodiments 1 to 3, it may be known that the color difference improves as the height $H_1$ increases. When the results of tables 1 to 3 are put together, it may be known that the efficiency is not remarkably reduced, and the color difference improves under a condition in which the minimum spaced distance $W_2$ between the first protruding part EP1 and the second protruding part EP2 adjacent thereto of the first pattern layer HT is in a range from about 4 µm to about 10 µm, the width $W_1$ of the first protruding part EP1 is in a range from about 4 µm to about 10 µm, the height $H_1$ of the first protruding part EP1 is in a range from about 7 µm to about 15 µm, and the inclination angle $\theta_1$ and $\theta_2$ is in a range from about 70° to about 90° in the display device DS according to an embodiment.

When the minimum spaced distance $W_2$ between the first protruding part EP1 and the second protruding part EP2 adjacent thereto is less than about 4 µm, the first pattern layer HT may not be provided. Although the height $H_1$ of the first protruding part EP1 is preferred to be higher, the height $H_1$ is desirably in a range from about 7 µm to about 15 µm in order to provide the inclination angle $\theta_1$ and $\theta_2$.

Figure 14:
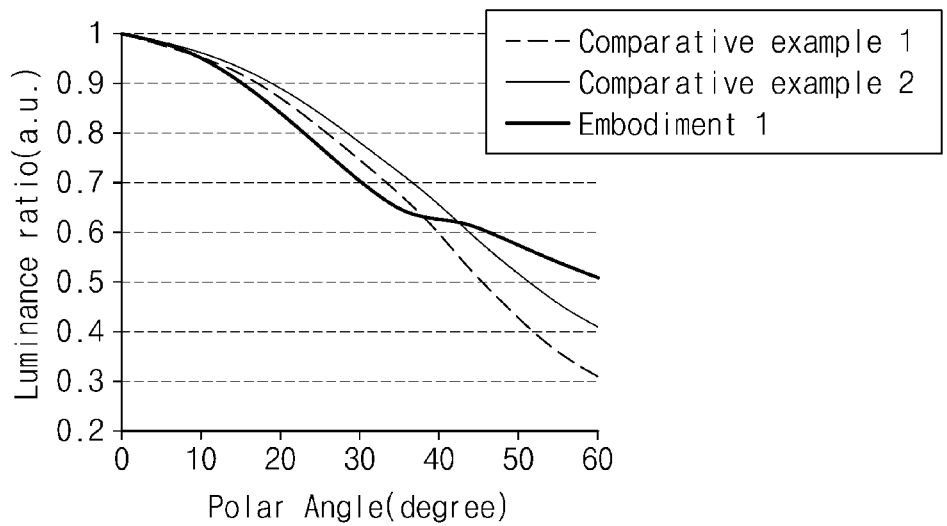
FIG. 14 is a graph representing a variation of a luminance ratio according to a side viewing angle.
Figure 15:
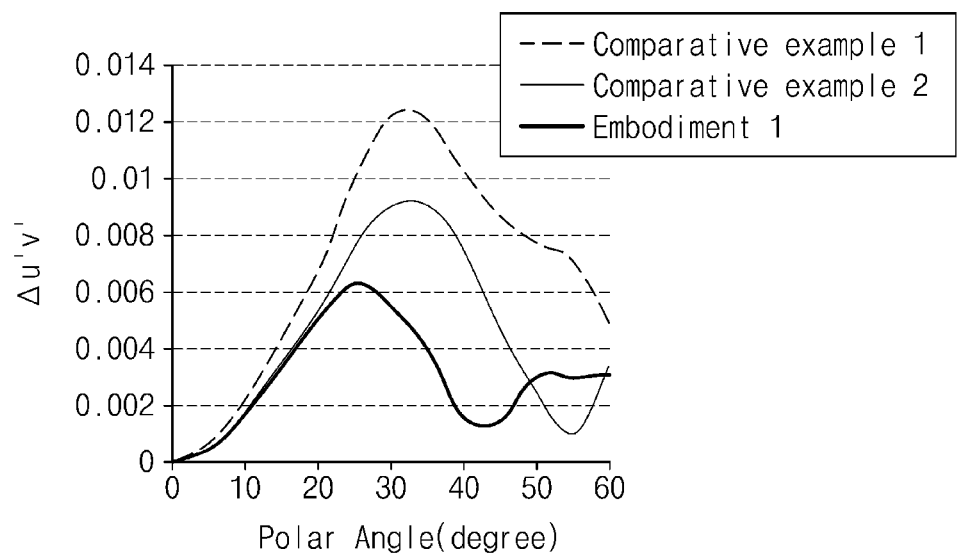
FIG. 15 is a graph representing a color difference according to a side viewing angle.

FIGS. 14 and 15 show a display quality according to a "polar angle" that is a viewing angle, and table 4 shows a portion of values of graphs in FIGS. 14 and 15. When the "polar angle" is about 0°, the angle is measured at a front and increases as moves to a side surface.

The front efficiency, the color difference, and the luminance rate are evaluated under a condition in which the width $W_1$ of the first protruding part EP1 is about 4 µm, the height $H_1$ is about 10 µm, the minimum spaced distance $W_2$ is about 8 µm, and the inclination angle $\theta_1$ and $\theta_2$ is about 85°.

FIG. 14 is a graph representing a luminance ratio according to a side viewing angle. FIG. 15 is a graph representing a color difference $\Delta u'v'$ according to a side viewing angle. In FIGS. 14 and 15, a comparative example 1 is a display device excluding an optical pattern layer and a scattering agent for improving a viewing angle, a comparative example 2 is a display device including a scattering agent, and an embodiment 1 is a display device including the optical pattern layer according to an embodiment.

FIG. 14 is a graph obtained by comparing values under a condition in which a luminance ratio of the comparative example 1 is about 100% when the side viewing angle is about 0°. A feature of about 100% of the luminance ratio is recorded as about 1 of a luminance ratio value on the graph. It may be known that the luminance ratio decreases as the side viewing angle increases, and the comparative example 2 has a smaller decrease amount of the luminance ratio in comparison with the embodiment 1 and the comparative example 1.

FIG. 15 is a graph obtained by measuring a color difference Δu'v' when a side viewing angle increases. The embodiment 1 shows that the color difference according to the side viewing angle has a relatively small value.

As shown below, Table 4 shows a portion of values of the graphs in FIGS. 14 and 15.

The "Efficiency" represents a front efficiency of a display device including a scattering agent or an optical pattern layer when a front efficiency of a display device excluding a material or a structure for improving a viewing angle is about 100%.

In FIG. 14, under a condition in which a luminance ratio is about 100% when the side viewing angle is about 0°, i.e., when viewed from a front, a luminance ratio at an angle of about 60° is shown as a "luminance ratio (60°)". In FIG. 15, a maximum value of color differences Δu'v' of each of the comparative example 1, the comparative example 2, and the embodiment 1 is shown as a "Max Δu'v' (0~60°)".

TABLE 4

| Classification | Efficiency | Max Δu'v' (0~60°) | Luminance ratio |
|---|---|---|---|
| Comparative example 1 | 100.0% | 0.0122 | 31% |
| Comparative example 2 | 93.3% (6.7% ↓) | 0.0090 (26% ↓) | 41% (33% ↑) |
| Embodiment 1 | 96.6% (3.4% ↓) | 0.0062 (46% ↓) | 51% (65% ↑) |

Comparative values under a condition in which a front efficiency of a display device excluding the scattering agent and the optical pattern layer according to an embodiment is about 100% are shown. A maximum value of color differences Δu'v' when the side viewing angle is in a range from about 0° to about 60° and a luminance ratio when the side viewing angle is about 60° are shown. Referring to results of the embodiment 1, it may be known that a decrease amount of the front efficiency is smaller than the comparative example 2, and a color difference improvement effect is satisfactory. For example, in case of the embodiment 1 including the optical pattern layer OT according to an embodiment, it may be known that the decrease amount of the front efficiency is smaller, and an improvement degree of the luminance ratio of the color difference according to the side viewing angle is greater than the comparative example 2.

The display device according to an embodiment may include the optical pattern layer including two pattern layers having different refractive indexes and disposed on the light emitting element layer may provide an improved display quality. The optical pattern layer according to an embodiment may include protruding parts, which are spaced apart from each other and disposed perpendicular with respect to the base part, to scatter light, thereby providing an improved display quality.

The display device having the improved display quality may be provided by optimizing the width of the bottom surface, the height that is the minimum spaced distance between the bottom surface and the ceiling surface, the inclination angle of the side surface to the bottom surface, and the distance between adjacent protruding parts.

An embodiment may provide the display device having the improved display quality by including the optical pattern layer including the first pattern layer and the second pattern layer, which have different refractive indexes, on the light emitting element layer.

An embodiment may provide the display device having the improved display quality according to the viewing angle without reduction in front efficiency by including the optical pattern layer in which the shape and arrangement distance of the vertically arranged protruding parts.

Although the embodiments of the invention have been described, it is understood that the invention should not be limited to these embodiments but various changes and modifications can be made by one ordinary skilled in the art within the spirit and scope of the invention as hereinafter claimed.

Hence, the scope of the invention shall be determined by the technical scope of the claims.

What is claimed is:

1. A display device comprising:
   a light emitting element layer,
   an optical pattern layer disposed on the light emitting element layer, the optical pattern layer comprising:
      first pattern layer having a first refractive index, the first pattern layer comprising:
         a base part; and
         protruding parts protruded from the base part and spaced apart from each other; and
      a second pattern layer disposed on the first pattern layer and having a second refractive index less than the first refractive index, and
   an optical member disposed between the light emitting element layer and the optical pattern layer, wherein
   the first pattern layer is disposed directly above the optical member,
   the second pattern layer is a planarization layer and is filled between the protruding parts, and
   the optical member comprises at least one of a polarizing layer and a color filter layer.

2. The display device of claim 1, wherein the light emitting element layer comprises:
   a first electrode;
   a second electrode facing the first electrode;
   a light emitting layer disposed between the first electrode and the second electrode and comprising an organic electroluminescent material or a quantum dot; and
   an encapsulation layer disposed on the second electrode,
   wherein the first electrode is a reflective electrode, and the second electrode is a transmissive electrode or a transflective electrode.

3. The display device of claim 1, wherein each of the protruding parts has a cylindrical or prismatic shape protruding from the base part.

4. The display device of claim 1, wherein each of the protruding parts comprises:
   a bottom surface adjacent to the base part;
   a ceiling surface facing the bottom surface; and
   a side surface extended between the bottom surface and the ceiling surface,
   wherein an inclination angle of the side surface with respect to the bottom surface on a cross section perpendicular to the base part is in a range from about 70° to about 90°.

5. The display device of claim 4, wherein the bottom surface has a width in a range from about 4 μm to about 10 μm on the cross section perpendicular to the base part.

6. The display device of claim 4, wherein:
each of the protruding parts has a height in a range from about 7 μm to about 15 μm and the height is a minimum spaced distance between the bottom surface and the ceiling surface.

7. The display device of claim 4, wherein:
the protruding parts comprise a first protruding part and a second protruding part, which are adjacent to each other, and
a minimum spaced distance between the bottom surface of the first protruding part and the bottom surface of the second protruding part is in a range from about 4 μm to about 10 μm.

8. The display device of claim 4, wherein the bottom surface has a width that is different from a width of the ceiling surface.

9. The display device of claim 1, wherein:
the first refractive index is from about 1.5 to about 1.7, and
a difference between the first refractive index and the second refractive index is equal to or greater than about 0.1.

10. A display device comprising:
a light emitting element layer comprising:
a first electrode;
a second electrode facing the first electrode; and
a light emitting layer disposed between the first electrode and the second electrode;
an optical pattern layer disposed on the light emitting element layer and comprising:
a first pattern layer having a first refractive index; and
a second pattern layer having a second refractive index less than the first refractive index; and
an optical member disposed between the light emitting element layer and the optical pattern layer or disposed on the optical pattern layer, wherein
the optical member comprises a color filter layer,
the color filter layer comprises a light shielding part disposed between a plurality of color filters, which are spaced apart from each other and an organic layer disposed on the plurality of color filters,
the light shielding part is configured to distinguish a boundary between adjacent color filters of the plurality of color filters, and
the organic layer is filled between the plurality of color filters.

11. The display device of claim 10, wherein:
the light emitting element layer further comprises an encapsulation layer disposed on the second electrode, and
the optical pattern layer is directly disposed on the encapsulation layer.

12. The display device of claim 10, wherein the first pattern layer comprises:
a base part; and
protruding parts disposed on the base part and spaced apart from each other,
wherein each of the protruding parts comprises:
a bottom surface adjacent to the base part;
a ceiling surface facing the bottom surface; and
a side surface extended between the bottom surface and the ceiling surface,
wherein each of the bottom surface and the ceiling surface has a circular or polygonal shape on a cross section parallel to the base part.

13. The display device of claim 12, wherein in each of the protruding parts:
a width of the bottom surface is in a range from about 4 μm to about 10 μm,
a height that is a minimum spaced distance between the bottom surface and the ceiling surface is in a range from about 7 μm to about 15 μm, and
an inclination angle of the side surface with respect to the bottom surface on a cross section perpendicular to the base part is in a range from about 70° to about 90°.

14. The display device of claim 10, wherein:
the first electrode is a reflective electrode, and
the second electrode is a transmissive electrode or a transflective electrode.

15. The display device of claim 10, wherein the light emitting element layer comprises an organic electroluminescent element or a quantum dot light emitting element.

16. The display device of claim 10, wherein:
the optical member further comprises a polarizing layer, and
the optical pattern layer is directly disposed on or below the polarizing layer.

17. The display device of claim 10, wherein:
the optical pattern layer is directly disposed on the color filter layer.

* * * * *